United States Patent [19]

Otto

[11] Patent Number: 4,812,849

[45] Date of Patent: Mar. 14, 1989

[54] NONQUADRATURE CORRECTION CIRCUIT

[75] Inventor: Vedon W. Otto, Burleson, Tex.

[73] Assignee: General Dynamics Corporation, Fort Worth, Tex.

[21] Appl. No.: 104,061

[22] Filed: Sep. 28, 1987

Related U.S. Application Data

[63] Continuation of Ser. No. 651,416, Sep. 17, 1984, abandoned.

[51] Int. Cl.[4] .......................... G01S 7/40; G01R 25/04
[52] U.S. Cl. ................................. 342/194; 328/155; 328/166; 324/83 Q
[58] Field of Search ............... 307/511, 512; 328/155, 328/166, 167; 342/194; 324/83 Q, 83 FE, 86

[56] References Cited

U.S. PATENT DOCUMENTS

| | | | |
|---|---|---|---|
| 3,950,750 | 4/1976 | Churchill et al. | 343/5 NQ X |
| 4,003,054 | 1/1977 | Goldstone | 343/5 NQ X |
| 4,122,448 | 10/1978 | Martin | 343/17.7 X |
| 4,475,088 | 10/1984 | Beard | 307/512 X |
| 4,484,194 | 11/1984 | Arvidsson | 343/5 NQ X |
| 4,489,392 | 12/1984 | Lewis | 343/5 NQ X |

*Primary Examiner*—Thomas H. Tarcza
*Assistant Examiner*—Gilberto Barrón, Jr.
*Attorney, Agent, or Firm*—James E. Bradley

[57] ABSTRACT

A phase comparator has additional circuitry for correcting nonquadrature error during operation of the comparator. The phase comparator has a 90 degree power divider which receives a reference signal input and produces two reference outputs, one shifted 90 degrees out of phase with the other. The phase comparator also has a zero degree power divider which receives a return signal, such as a reflected signal of a radar transmitter unit. The outputs of the power dividers are applied to mixers and filters to result in an I video output whose frequency is the difference between the reference and signal input frequencies, and a Q video output which is identical in frequency but shifted 90 degrees. The correction circuit includes a frequency trap connected to the reference input and tunable about a center frequency of approximately the third harmonic of the fundamental reference frequency. While the phase comparator is operating, the trap is detuned from the center frequency while the phase error is monitored until the phase error nears zero. Band pass filter means which electrically isolate the power divider from external circuitry can improve operation.

17 Claims, 1 Drawing Sheet

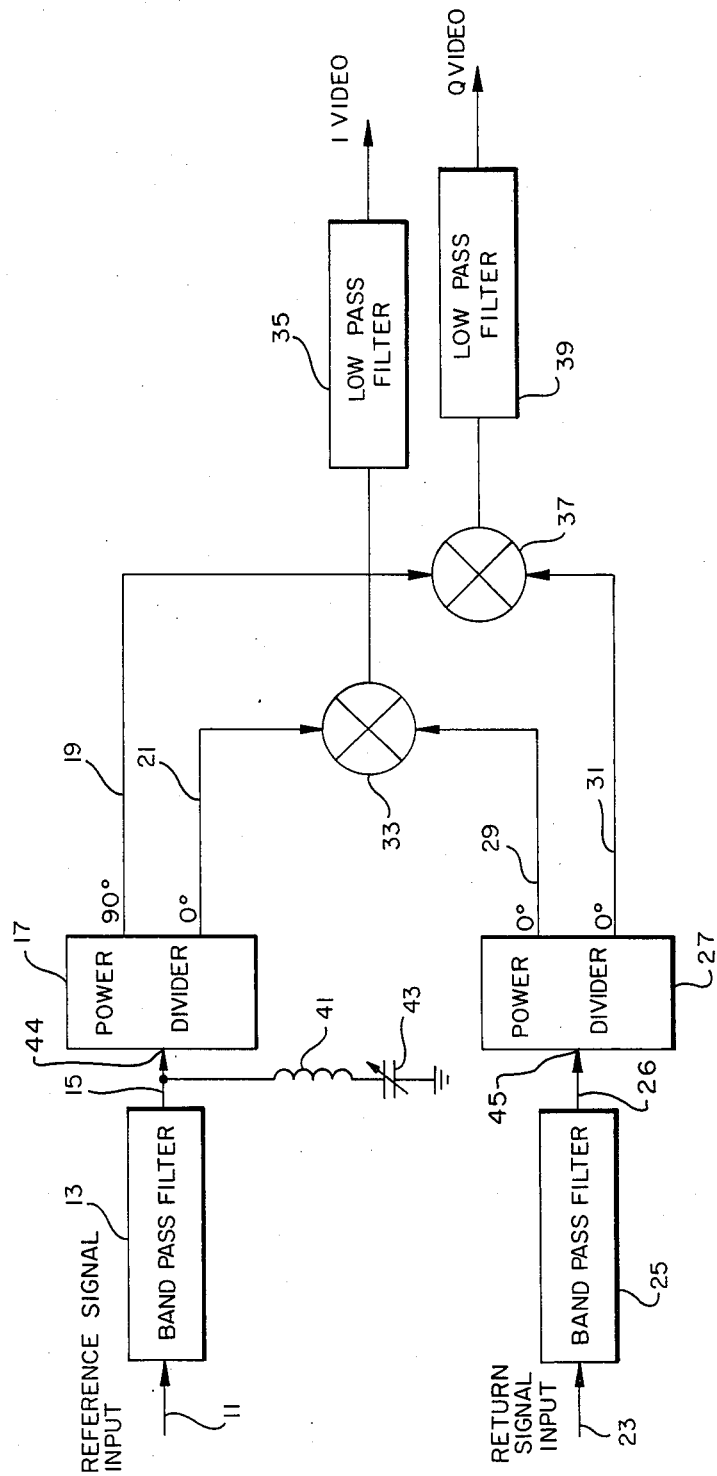

NONQUADRATURE CORRECTION CIRCUIT

This application is a continuation of application Ser. No. 651,416, filed Sept. 17, 1984, now abandoned.

BACKGROUND OF THE INVENTION

1. Field of the Invention

This invention relates in general to radar and sonar systems, and in particular to a circuit for correcting errors associated with a quadrature phase comparator for a radar or sonar system.

2. Description of the Prior Art

In some radar and sonar applications, doppler processing is used to enhance sensitivity to signals of interest and to suppress signals which are not of interest and are called clutter. Doppler processing is more effective if the phase and the amplitude of the return signal are detected. To preserve both phase and amplitude, two videos, I and Q, are detected. The I video is proportional to the amplitude of the return signal multiplied by the cosine of the phase difference between the return signal and a reference signal. The Q video is proportional to the amplitude of the return signal multiplied by the sine of that phase difference.

In a processing circuit, the I and Q video are created by a quadrature phase comparator. The phase comparator normally has a 90 degree power divider which receives a reference frequency input and produces two reference outputs. One of the reference outputs is shifted 90 degrees out of phase with the other. The phase comparator also has either a 0/0 degree or a 0/180 degree power divider which receives the return signal input and produces two in phase return signal outputs (0/0), or one output 180 degrees out of phase with another output (0/180). The two reference outputs and the two return signal outputs are applied to two double-balanced mixers. Each mixer receives one of the reference outputs and one of the return signal outputs and produces the sum and the difference of each to a low pass filter. The result is an I video output whose frequency is the difference between the reference and return signal input frequencies, and a Q video output which is identical in frequency to the I video output but shifted 90 degrees in phase.

In an actual phase comparator as described, there is an error called nonquadrature. The error results from I and Q videos that are not exactly 90 degrees out of phase. This nonquadrature error is one of the most common and most difficult to cure errors that is present in receiver systems which are trying to recover both the amplitude and the phase difference from a stable reference of a return signal. In a system which makes frequency analysis of the return signal, nonquadrature error will cause a false target called an image to appear whose doppler frequency or velocity is the same as that of a real target but of opposite sign. One simple measure of a nonquadrature error, after amplitude errors have been balanced out, is the image rejection; that is, the ratio of the power of the image or false target to the power of the true target. Under certain circumstances these images can degrade the performance of the overall system.

In the prior art, this nonquadrature error can be reduced to approximately one degree or less only by carefully matching the internal transformers and hand tuning during manufacturing. This increases the cost of manufacturing the phase comparator considerably.

SUMMARY OF THE INVENTION

In this invention, an inexpensive circuit is incorporated into a conventional quadrature phase comparator to dramatically reduce the nonquadrature error. It has been found that modulation of the phase delay of a power divider incorporated in the comparator and receiving signals from the reference signal input can effectively compensate for all other phase delays in the comparator to correct for nonquadrature error such that I and Q video outputs are close to or exactly 90 degrees out of phase. This can be accomplished by controlling the impedance to the third harmonic current that is being reflected out of the power divider receiving the reference signal input so as to alter the effects of the third harmonic standing wave in the line feeding said power divider. The circuit can be implemented by a frequency trap which is connected to the reference input (or reference signal input) of the phase comparator and has a center frequency approximately the third harmonic of the fundamental reference frequency. Such a trap presents a low to zero impedance to a band of frequencies about the center frequency but a very high impedance to all other frequencies. The trap is tunable to filter out of the reference signal a variable portion of the energy of the third harmonic of the fundamental reference frequency. During operation of the comparator, nonquadrature error is monitored and the trap modulated to detune it slightly from the third harmonic of the fundamental reference frequency until the net nonquadrature error between the I and Q video output is reduced to near zero.

Band pass filter means advantageously may be connected to the input of the reference signal power divider of the phase comparator, or to its return signal power divider, or to both, for passing only frequencies approximately that of the fundamental reference frequency. Each such filter means are connected as close as feasible to the respective power dividers and serve to isolate the dividers, particularly at the region of the third harmonic of said fundamental reference frequency, from adverse effects on nonquadrature error arising, for example, from changes in electrical path length due to ambient temperature change. The trap beneficially comprises an inductor in series with a variable capacitor connected between ground and the line from the band pass filter to the power divider associated with the reference signal input.

BRIEF DESCRIPTION OF THE DRAWINGS

FIG. 1 is a schematic illustrating a phase comparator having a correction circuit constructed in accordance with this invention.

DESCRIPTION OF THE PREFERRED EMBODIMENT

The reference signal input 11 is applied to a band pass filter 13. Band pass filter 13 is a conventional filter that blocks all frequencies of the reference signal input except the fundamental reference frequency. The output of the band pass filter 13 is connected to a line 15 which leads to a conventional reference signal power divider 17, which is preferably a 0/90 degree divider. Power divider 17 produces two reference signals 19 and 21, each containing one-half the power of the input signal 11. The zero reference signal 21 is ideally in phase with the input reference signal 11. The 90 degree reference signal 19 is ideally shifted by 90 degrees from the reference input signal 11. The reference input 11 is produced by a stable oscillator.

The return signal input 23 is the input received back as a result of a transmission wave reflecting on a target back to a receiver (not shown). The return signal input 23 will have a frequency that is approximately that of the reference input signal 11, because it was transmitted at substantially the same frequency as the reference signal. However, the return signal will be different, with the amplitude of the wave form indicating the size of the target or object. A difference in phase from the reference signal 11 indicates the range or distance to the target. A change in frequency indicates the velocity of the target. The return signal input 23 is applied to a band pass filter 25 that is similar to band pass filter 13. All but a narrow range of frequencies approximately that of the fundamental reference frequency will be blocked. The resulting return signal input is applied to a return signal power divider 27, which is preferably a 0/0 degree divider. The outputs 29 and 31 each have one-half the power of the input return signal 23, but are the same phase as the input signal 23. A 0/180 degree power divider could also be used as it would provide the same result except for reversing the sign of the detected doppler.

The in-phase reference signal 21 and one of the return signals (29) is applied to a double-balanced mixer 33. The output of the double-balanced mixer 33 is the sum and the difference of the two inputs 21 and 29. In phase comparator applications, the reference 21 is approximately the same frequency as the return signal 29. Therefore, the sum component of output of the mixer 33 is a high frequency which is blocked by a low pass filter 35. The output from filter 35 is the I video output, which is a signal whose frequency is the difference between the frequencies of the two inputs 21 and 29.

In a like manner, the 90 degree reference signal 19 and the return signal 31 are applied to a double-balanced mixer 37. The output again is the sum and the difference. This output is applied to a low pass filter 39. The low pass filter 39 yields the Q video which is identical in frequency to the I video in a perfect system, but the phase is shifted 90 degrees.

Each element in the phase comparator of FIG. 1 contributes a small phase delay to the process. These delays are additive so that the total phase delay due to imperfect components in the I video path is the sum of the delays from the power divider 17 (output 21), the delay from the power divider 27 (output 29), the delay from the double-balanced mixer 33 and the delay from low pass filter 35. In the Q path, the total phase delay is the sum of the delays from the 90 degree power divider 17 (output 19), the zero degree power divider 27 (output 31), the mixer 37, and the low pass filter 39. Since nonquadrature error is concerned only with the misalignment of I video with respect to Q video, the nonquadrature error is equal to the delay on the I video path less the delay on the Q video path.

This error is reduced to near zero by the use of a frequency trap or modulator comprising fixed inductor 41 and variable capacitor 43. Inductor 41 is connected to line 15 between band pass filter 13 and power divider 17. This line is beneficially made as short as possible, and preferably the connection of inductor 41 is physically made as close as possible to the power divider 17, i.e., at or substantially at the divider input 44. The variable capacitor 43 is connected to ground. This trap has a center frequency that is the third harmonic of the fundamental reference frequency. The third harmonic is three times the frequency of the fundamental reference frequency. The trap can be tuned to vary the phase delay between the two video outputs to force the nonquadrature error to approximately zero. This is implemented by installing a trap tunable about the third harmonic. If the trap is set to the center frequency it is then detuned while the phase comparator is operating until a phase difference meter (not shown) which is measuring I and Q video shows exactly 90 degrees. In the alternative, measurement can be made by varying the setting of the capacitor 43 to detune the trap until a minimum image in a frequency analysis circuit is observed.

Detuning the frequency trap alters or modulates the third harmonic standing wave which will be present in the line 15 feeding the reference input to power divider 17. The variable impedance of the frequency trap presented to the third harmonic provides for a variable amount of the third harmonic current to be passed to ground. This allows one to vary the net phase delay (difference between the delay of output 19 and output 21) of the 90 degree power divider 17. Control of the quantity of the phase delay of the ninety degree power divider 17 will allow one to set a phase delay value for the outputs which will yield a net nonquadrature error of zero for the entire phase comparator, because the net phase error is the phase delay on the I path less the phase delay on the Q path.

The band pass filters 13 and 25 are used to stabilize the electrical length of the input paths or lines to, and thus the signals presented to, the power dividers 17 and 27. Changes in these paths with temperature, for example, will change both the operation of the phase comparator and the operation of the frequency trap elements 41 and 43 by altering the phase delay of the reference and return signals with resulting change in the I and Q video outputs. This would undesirably require re-adjustment of the capacitor 43 during operation to reduce or minimize the nonquadrature error. The band pass filters 13 and 25 are placed as close as possible to the inputs 44 and 45 of the power dividers to, in general, eliminate the need for periodic adjustment due to changes in the paths. The band pass filters particularly must block the region of the third harmonic of the fundamental reference frequency. This limits the third harmonic to lines 15 and 26 which are preferably as short as possible thus to electrically isolate the dividers' inputs from the location of the respective signal inputs 11 and 23 at such third harmonic region.

It should be noted that the power at the fundamental frequencies of the reference and return signals flows respectively from the reference signal source (oscillator - not shown) or input into the 90 degree power divider 17 and from the return signal source (input) to power divider 27. However, the harmonic frequencies are created by non-linearities in the phase comparator and harmonic frequency power flows respectively toward the reference and return signal sources. Filters 13 and 25, when connected to shorten and limit the respective electrical path lengths of the harmonic frequencies to the distances between the power dividers and their associated band pass filters (band pass filter output lines 15 and 26), electrically isolate the dividers from the external circuitry (not shown) supplying the reference and return signal inputs. This reduces the magnitude and effect of changes potentially occurring to the quadrature of the I and Q videos thereby capacitance to vary impedance), e.g., with temperature change. The trap attenuates the third harmonic of the fundamental frequency of the reference signal. The band pass filters are best connected immediately at the inputs (44 and 45) to their associated dividers. Excellent results have been obtained when the band pass filter output lines have each been thus shortened to about 3 inches.

The components of this invention are conventional. The power dividers 17 and 27, mixers 33 and 37 and low pass filters 35 and 39 are part of a conventional quadrature phase comparator. In the preferred embodiment, the phase comparator is manufactured by Lorch, Inc. and indentified by the number CP410-30-10. The 90 megahertz (Mhz) frequency trap for 30 Mhz fundamental reference frequency applied to reference input 11 preferably includes a 12 microhenry inductor 41 having about eight turns with number 24 AWG magnetic wire on a ferrite core. The variable capacitor 43 for such a frequency trap preferably comprises a fixed capacitor (not shown) of 5.6 pf in parallel with a variable capacitor of 0.8 to 8.5 pf.

The invention has significant advantages. The frequency trap is considerably less expensive than matching and hand tuning the internal transformers of a phase capacitor. Using this circuit, an off the shelf phase comparator with a nonquadrature error of approximately 2 degrees was modified to yield a nonquadrature error of as little as 0 to 5 tenths of a degree.

While the invention has been shown in connection with a specific embodiment, it should be apparent to those skilled in the art that it is not so limited but is susceptible to various changes all within the scope of the invention.

I claim:

1. In a power divider which receives at a reference signal input, a reference signal comprised of a fundamental reference frequency and its harmonics, the power divider producing two outputs, an improved means to vary the phase delay between the two outputs, comprising:
    tunable frequency trap means connected between the reference signal input and a ground, the trap having a center frequency which is approximately the third harmonic of the fundamental reference frequency for providing a low impedance path to ground for the third harmonic of the fundamental reference frequency but a high impedance to ground for the fundamental reference frequency.

2. The power divider according to claim 1 in which the power divider is of a type which produces the outputs nominally 90 degrees out of phase with respect to each other.

3. The power divider according to claim 1, further comprising:
    filter means located between the reference signal input and the power divider for passing the fundamental reference frequency and blocking the third harmonic of said frequency, the trap being connected between the filter means and the power divider to stabilize the electrical path length against signal variations at the input of said divider in the region of said third harmonic frequency.

4. In a phase comparator having a reference signal power divider whose input is a reference signal comprising a fundamental reference frequency and its harmonics at a reference input, the reference signal power divider producing two reference outputs, a return signal power divider which receives a return signal input and produces two return signal outputs, and two mixers, each of which receives one of the reference outputs and one of the signal outputs and produces the sum and difference of each which are passed to a low pass filter to produce an I video output whose frequency is the difference between the reference and signal input frequencies, and a Q video output which is identical in frequency to the I video output but shifted nominally 90 degrees in phase, an improved means to reduce nonquadrature error between the I and Q video outputs, comprising:
    a tunable frequency trap means connected between the reference input of the reference signal power divider and ground for providing a low impedance path to ground for the third harmonic of the fundamental reference frequency but a high impedance to ground for the fundamental reference frequency.

5. The phase comparator according to claim 4 wherein the frequency trap comprises:
    an inductor and a variable capacitor connected in series and to ground.

6. The phase comparator according to claim 4 further comprising:
    filter means connected between the reference signal input and the reference signal power divider for passing the fundamental frequency of the reference signal and blocking the third harmonic of said frequency between said reference signal input and said power divider.

7. The phase comparator according to claim 4 further comprising:
    filter means connected between the return signal input and the return signal power divider for blocking frequencies in the region of the third harmonic of the fundamental reference frequency from being transmitted from the divider to the return signal input.

8. The phase comparator according to claim 4 further comprising:
    filter means respectively between the reference signal input and its associated power divider and the return signal input and its associated power divider for respectively passing the fundamental frequencies of the reference and return signals to their respective power dividers but isolating the power dividers at about the respective third harmonics of said signals from the respective signal inputs so as to reduce the potential for phase shifts resulting from alteration of the third harmonic standing wave thereby obviating the need for frequent readjustment of said tunable frequency trap to minimize nonquadrature error.

9. A phase comparator circuit for reducing the nonquadrature error between I and Q video outputs shifted nominally 90 degrees one from the other in a doppler signal processing apparatus comprising:
    (a) reference signal input means for receiving a reference signal;
    (b) said reference signal containing a fundamental frequency and harmonics thereof;
    (c) return signal input means for receiving a return signal;
    (d) first and second power divider means for receiving a signal respectively from said reference and said return signal input means;
    (e) said first power divider means capable of producing two reference signal outputs;
    (f) said second power divider means capable of producing two return signal outputs;

(g) one of the power divider means having its signal outputs shifted nominally 90 degrees out of phase one to the other, and the other power divider having its signal outputs optionally nominally in phase or shifted 180 degrees out of phase one to the other;

(h) two mixers each connected to receive a different one of said reference signal outputs and a different one of said return signal outputs from each power divider means and respectively output the sum and difference of the frequencies thereof for transmission to low pass filter means which block the sum components of the mixer outputs to produce I and Q video signals nominally 90 degrees out of phase one to the other; and (i) tunable frequency trap means connected between said first power divider means and ground for modulating the third harmonic of the fundamental reference frequency of said reference signal to reduce the nonquadrature phase error of the I and Q videos when the trap is detuned from the third harmonic of the fundamental frequency of said reference signal.

10. A method for correcting the nonquadrature error between the I and Q video outputs from a phase comparator receiving reference and return signals and having a power divider receiving the reference signals and means for modulating the phase delay of said divider comprising:

(a) operating the phase comparator; and (b) while continuing to operate the phase comparator modulating the phase delay of the said power divider by varying the impedance at the power divider input to the third harmonic of the fundamental reference frequency to reduce to a minimum the nonquadrature error between said outputs.

11. A method for correcting the nonquadrature error between the I and Q video outputs from a phase comparator receiving reference and return signals and having a power divider receiving the reference signals and means for modulating the phase delay of said divider comprising:

(a) operating the phase comparator;

(b) while continuing to operate the phase comparator modulating the phase delay of the said power divider by varying the impedance at the power divider input to the third harmonic of the fundamental reference frequency to reduce to a minimum the nonquadrature error between said outputs; and (c) filtering said reference signal through band pass filter means before varying said impedance at the power divider input to isolate the phase comparator from signal changes which may affect nonquadrature error by alteration of frequencies in the area of the third harmonic of the fundamental reference frequency of said reference signal.

12. A method for correcting the nonquadrature error between the I and Q video outputs from a phase comparator receiving reference and return signals and means for modulating the phase delay of said divider comprising:

(a) operating the phase comparator;

(b) while continuing to operate the phase comparator modulating the phase delay of the said power divider by varying the impedance at the power divider input to the third harmonic of the fundamental reference frequency to reduce to a minimum the nonquadrature error between said outputs;

(c) filtering said reference signal through band pass filter means before varying said impedance at the power divider input to isolate the phase comparator from signal changes which may affect nonquadrature error by alternation of frequencies in the area of the third harmonic of the fundamental reference frequency of said reference signal; and (d) filtering said return signal through band pass filter means to isolate the phase comparator from signal changes which may affect nonquadrature error by alteration of frequencies in the area of the third harmonic of the fundamental reference frequency of said reference signal.

13. The method according to claim 10 additionally comprising providing said power divider as a 90 degree power divider producing two output signals shifted nominally 90 degrees out of phase one from the other.

14. A method for correcting nonquadrature error in a phase comparator of the type having a 90 degree power divider which receives a reference signal comprised of a fundamental reference frequency and its harmonics at a reference signal input, 90 degree power divider producing two reference outputs, one being shifted 90 degrees out of phase with the other, comprising:

connecting modulator means between the reference signal input and ground for varying the impedance presented to the third harmonic of the fundamental reference frequency; and while operating the phase comparator, varying the modulator means until the error nears zero.

15. The method according to claim 14 further comprising providing said modulator means as frequency trap means having a center frequency which is approximately said third harmonic;

connecting the trap means with one end to ground and the other end to a point between said reference signal input and the 90 degree power divider; and accomplishing said modulation by tuning said trap.

16. The method according to claim 15 further comprising:

placing band pass filter means between the reference signal input and the 90 degree power divider for electrically isolating the 90 degree power divider input from the reference signal input at approximately the third harmonic of the fundamental reference frequency.

17. A method for correcting nonquadrature error in a phase comparator of the type which receives a reference signal at a reference signal input and a return signal at a return signal input and incorporates power dividers and produces two output signals whose frequency is equal to the frequency difference between said inputs, one output signal being shifted nominally 90 degrees out of phase with the other comprising:

placing filter means between the reference signal input and its associated power divider for substantially electrically isolating said divider input and about the third harmonic of the fundamental of the reference signal frequency;

connecting a tunable frequency trap with one end to ground and the other end to a point between the filter means and the power divider receiving the reference signal, the frequency trap being of a type that will pass to ground the third harmonic of the fundamental reference frequency;

passing to ground through the frequency trap a portion of the current whose frequency is the third harmonic of the fundamental reference frequency; and during operation of the phase comparator tuning the trap to vary the impedance to ground at said third harmonic frequency until the nonquadrature error nears zero.

* * * * *